United States Patent
Iriguchi (10) Patent No.: US 7,504,974 B2
(45) Date of Patent: Mar. 17, 2009

(54) SELECTING CIRCUIT

(75) Inventor: Masao Iriguchi, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 0 days.

(21) Appl. No.: 11/902,472

(22) Filed: Sep. 21, 2007

(65) Prior Publication Data
US 2008/0074167 A1    Mar. 27, 2008

(30) Foreign Application Priority Data
Sep. 22, 2006    (JP)    ............................. 2006-257366

(51) Int. Cl.
    *H03M 1/62*    (2006.01)
(52) U.S. Cl. ...................... 341/139; 341/155
(58) Field of Classification Search ................. 341/143, 341/144, 139, 155, 166
    See application file for complete search history.

(56) References Cited

U.S. PATENT DOCUMENTS

| 4,673,807 | A  | * | 6/1987  | Kobayashi et al. .... 250/214 AG |
| 6,707,405 | B2 |   | 3/2004  | Kuttner |
| 6,975,256 | B1 | * | 12/2005 | Bolda et al. ................. 341/139 |
| 2003/0194101 | A1 |   | 10/2003 | Sexauer et al. |
| 2005/0116769 | A1 | * | 6/2005  | Tei et al. ........................ 330/9 |
| 2006/0126867 | A1 | * | 6/2006  | Walden ....................... 381/119 |
| 2006/0188268 | A1 | * | 8/2006  | Liao et al. ................... 398/201 |

FOREIGN PATENT DOCUMENTS

| JP | 8-79032      | 3/1996 |
| JP | 2003-198345  | 7/2003 |
| JP | 2003-229736  | 8/2003 |
| JP | 2004-7590    | 1/2004 |

* cited by examiner

*Primary Examiner*—Brian Young
(74) *Attorney, Agent, or Firm*—McGinn IP Law Group, PLLC (57) ABSTRACT

A selecting circuit having minimal signal distortion caused by non-linearity of semiconductor switching elements includes a plurality of circuit groups each comprising an input terminal (INa); serially connected resistors (R1a, R2a) having a first end connected to the input terminal; a semiconductor switching element (SW1a) having a first end connected to a node between the resistors; and semiconductor switching elements (SW2a, SW3a) having first ends connected to a second end of the resistors (R1a, R2a). The circuit further includes an operational amplifier (OP) having an inverting input terminal to which second ends of semiconductor switching elements (SW1a, SW1b, . . . , SW1n) in respective ones of the circuit groups are connected in common, and an output terminal to which second ends of semiconductor switching elements (SW2a, S2b, . . . , SW2n) in respective ones of the circuit groups are connected in common; and an output terminal (OUT) to which second ends of semiconductor switching elements (SW3a, SW3b, . . . , SW3n) in respective ones of the circuit groups are connected in common.

18 Claims, 6 Drawing Sheets

SELECTING CIRCUIT

REFERENCE TO RELATED APPLICATION

This application is based upon and claims the benefit of the priority of Japanese patent application No. 2006-257366, filed on Sep. 22, 2006, the disclosure of which is incorporated herein in its entirety by reference thereto.

FIELD OF THE INVENTION

This invention relates to a selecting circuit and, more particularly, to a selecting circuit for selecting and outputting one of a plurality of analog signals.

BACKGROUND OF THE INVENTION

Signal processing in audio equipment often includes converting all of a plurality of different sound sources to analog signals, selecting one analog signal from the plurality of analog signals by a selecting circuit, converting the analog signal to a digital signal by an analog-to-digital (A/D) conversion and then applying audio processing by a DSP (Digital Signal Processor), etc. For example, Patent Document 1 describes a selector circuit that eliminates the need for analog switches, etc., that block output signals from playback units. In accordance with this selector circuit, a plurality of playback units receive a control signal and only a control unit that has been selected based upon the control signal is placed in the operating state; control units other than that placed in the operating state are made inoperative. Outputs from the playback units are supplied to and added by an adder circuit comprising an operational amplifier. In this case, only the playback units that have been placed in the operating state produce outputs; a playback unit that has been rendered inoperative does not produce an output. All outputs from playback units that have been placed in the operating state flow into the adder circuit. Accordingly, even if the output resistance of a playback unit rendered inoperative is low, the output from an operative playback unit will not be drawn into an inoperative playback unit. As a result, the output from a playback unit rendered operative will not be interfered with by a playback unit that has been rendered inoperative. This makes analog switches unnecessary.

The selector circuit described in Patent Document 1 operates so as to render an unused playback unit inoperative and add output signals from all playback units using an adder circuit. Consequently, it is required that the circuit operate in such a manner that each playback unit be rendered operative or inoperative. The result is a complicated circuit arrangement. Further, since an output signal from a playback unit that has been rendered inoperative is input to the adder circuit, there is the danger that noise from an inoperative playback unit will mix in.

Patent Document 2 discloses an integrating analog multiplexer that includes a plurality of multiplexer inputs, a multiplexer output, a switch device and a differential amplifier having an inverting input, a non-inverting input and an output. In this multiplexer the amplifier output forms the multiplexer output, the differential amplifier is connected as an inverting amplifier by a feedback path from the amplifier output to the inverting input, and the switch device selectively connects any one of the plurality of multiplexer inputs to the inverting input.

Patent Document 3 provides a space-saving and cost-effective on-chip solution for an audio output device and discloses a circuit that makes it possible to superimpose various audio input signals such as voice, music and a call signal. This circuit includes two or more audio input channels, a switch arrangement for driving different input audio signals, an arrangement of resistors for each of audio signal input lines, and an inverting voltage amplifier having inputs and an output and serving as an output stage for controlling superimposed audio signals. The input is coupled to a reference voltage and the audio signals are superimposed by an activated switch or switches. The output can be used in order to activate a loudspeaker. This circuit further includes input resistors for the voltage amplifier and means for setting the gain of the amplifier of the output stage.

As related art, Patent Document 4 discloses a gain control circuit capable of inputting a signal that has exceeded power-supply voltage and of changing the set range of gain. The gain control circuit is a circuit that operates as a simple power supply and has an amplifier so adapted that gain can be varied. The circuit has a plurality of input terminals to each of which is connected one end of a respective one of a plurality of resistance elements having weighted resistance values. The other ends of the plurality of resistance elements are tied together and the common connection node is connected to the input side of a variable resistance circuit for varying gain. It is possible to input a signal to all or some of the plurality of input terminals.

Patent Document 1: JP Patent Kokai Publication No. JP-A-8-79032
Patent Document 2: JP Patent Kokai Publication No. JP-P2003-198345A
Patent Document 3: JP Patent Kokai Publication No. JP-P2004-7590A
Patent Document 4: JP Patent Kokai Publication No. JP-P2003-229736A

SUMMARY OF THE DISCLOSURE

In the following the analyses are given by the present invention. The disclosures of the above mentioned Patent Documents as the related art are incorporated herein by reference thereto.

In the devices described in Patent Documents 2 and 3, semiconductor switching elements such as FETs are used as switches for selecting signal sources, and the semiconductor switching elements are connected to the signal sources in series with resistance elements and reside on the signal paths. Although Patent Document 3 does not describe the switch arrangement in particular, use of semiconductor switching elements as the switches would be considered ordinary if high integration and lower cost are taken into consideration. In a device of this kind, non-linearity of the semiconductor switching elements with respect to input signals is a problem. Specifically, it is required that a signal that is output from an audio unit have a comparatively large amplitude and a very small distortion characteristic. Nevertheless, these conventional devices are such that an output signal from a signal source is input to an amplifier via a serially connected semiconductor switching element and resistance element, and the semiconductor switching element is controlled in such a manner that an on/off control signal is applied to a control terminal to render intermittent the output signal from the signal source. In these conventional devices, therefore, signal distortion in a selected signal may increase owing to non-linearity of the semiconductor switching element that selects the signal source, such as an audio unit.

According to a first aspect of the present invention there is provided a selecting circuit that comprises: a plurality of first circuit groups, each of which includes: a selecting circuit input terminal; a first resistor group composed of two or more serially connected resistors and having a first end connected to the selecting circuit input terminal; a first semiconductor switching element having a first end connected to any one node between two resistors in the first resistor group; a second semiconductor switching element having a first end connected to a second end of the first resistor group; and a third semiconductor switching element having a first end connected to the second end of the first resistor group. The selecting circuit further comprises an operational amplifier having an inverting input terminal connected in common with second ends of the first semiconductor switching elements in respective ones of the first circuit groups, and an output terminal connected in common with second ends of the second semiconductor switching elements in respective ones of the first circuit groups; and a selecting circuit output terminal connected in common with second ends of the third semiconductor switching elements in respective ones of the first circuit groups. The above features may be termed as "mode 1", too.

The meritorious effects of the present invention are summarized as follows.

In accordance with the present invention, semiconductor switching elements for selecting signal sources are first and second semiconductor switching elements. Since these semiconductor switching elements are not in the signal paths, the influence of the ON resistance in the first and second semiconductor switching elements on the input/output characteristic of the selecting circuit is very small. This makes it possible to minimize signal distortion caused by non-linearity of the semiconductor switching elements.

Other features and advantages of the present invention will be apparent from the following description taken in conjunction with the accompanying drawings, in which like reference characters designate the same or similar parts throughout the figures thereof.

PREFERRED MODES OF THE INVENTION

The following modes may be realized according to the present invention.

Instead of one end of the first semiconductor switching element being connected to any one node between two resistors in the first resistor group, the first resistor group includes three or more resistors, and gain-adjusting semiconductor switching elements may be inserted between the first end of the first semiconductor switching element and respective nodes between each of the resistors (mode 2).

Instead of one end of the first semiconductor switching element being connected to any one node between two resistors in the first resistor group, the first resistor group includes three or more resistors, gain-adjusting semiconductor switching elements may be inserted between the inverting input terminal and respective nodes between each of the resistors, and the first semiconductor switching element may be eliminated (mode 3).

A first capacitor may be inserted between the selecting circuit input terminal and the first resistor group (mode 4).

A second capacitor may be provided between the selecting circuit output terminal and ground (mode 5).

The selecting circuit may further comprise second circuit groups the number of which is identical with the number of the first circuit groups, each of the second circuit groups including: a selecting circuit inverted input terminal; a second resistor group composed of two or more serially connected resistors and having a first end connected to the selecting circuit inverted input terminal and a second end connected to ground; and a fourth semiconductor switching element having a first end connected to any one node between two resistors in the second resistor group; wherein the operational amplifier further includes a non-inverting input terminal to which second ends of the fourth semiconductor switching elements in respective ones of the second circuit groups are connected in common (mode 6).

The selecting circuit may further comprise second circuit groups the number of which is identical with the number of the first circuit groups, each of the second circuit groups including: a selecting circuit inverted input terminal; a second resistor group composed of two or more serially connected resistors and having a first end connected to the selecting circuit inverted input terminal and a second end connected to ground; a fourth semiconductor switching element having a first end connected to any one node between two resistors in the second resistor group; a fifth semiconductor switching element having a first end connected to a second end of the second resistor group; and a sixth semiconductor switching element having a first end connected to a second end of second first resistor group; and a selecting circuit inverted output terminal connected in common with second ends of the sixth semiconductor switching elements in respective ones of the second circuit groups; wherein the operational amplifier may further include a non-inverting input terminal and an inverting output terminal, second ends of the fourth semiconductor switching elements in respective ones of the second circuit groups being connected in common with the non-inverting terminal, and second ends of the fifth semiconductor switching elements in respective ones of the second circuit groups being connected in common with the inverting output terminal (mode 7).

Instead of one end of the first semiconductor switching element being connected to any one node between two resistors in the first resistor group, the first resistor group may include three or more resistors, and first gain-adjusting semiconductor switching elements may be inserted between the first end of the first semiconductor switching element and respective nodes between each of the resistors; and instead of one end of the fourth semiconductor switching element being connected to any one node between two resistors in the second resistor group, the second resistor group may include three or more resistors, and second gain-adjusting semiconductor switching elements may be inserted between the first end of the fourth semiconductor switching element and respective nodes between each of the resistors (mode 8).

Instead of one end of the first semiconductor switching element being connected to any one node between two resistors in the first resistor group, the first resistor group may include three or more resistors, first gain-adjusting semiconductor switching elements may be inserted between the inverting input terminal and respective nodes between each of the resistors, and the first semiconductor switching element may be eliminated; and instead of one end of the fourth semiconductor switching element being connected to any one node between two resistors in the second resistor group, the second resistor group may include three or more resistors, second gain-adjusting semiconductor switching elements may be inserted between the non-inverting input terminal and respective nodes between each of the resistors, and the fourth semiconductor switching element may be eliminated (mode 9).

In the selecting circuit according to any one of modes 7 to 9, a first capacitor may be inserted between the selecting circuit input terminal and the first resistor group; and a third capacitor may be inserted between the selecting circuit inverted input terminal and the second resistor group (mode 10).

In mode 7 a fourth capacitor may be provided between the selecting circuit output terminal and the selecting circuit inverted input terminal (mode 11).

An A/D converter having the selecting circuit set forth in any one of modes 1 to 11 as a front-end circuit (mode 12).

A selecting circuit as an example of the present invention comprises a plurality of switch groups. Each switch group includes an input terminal (INa in FIG. 1A); a resistor group composed of two or more serially connected resistors (R1a and R2a in FIG. 1A) and having the first end connected to the input terminal; a first semiconductor switching element (SW1a in FIG. 1A) having a first end connected to any one node between two resistors; a second semiconductor switching element (SW2a in FIG. 1A) having a first end connected to a second end of the resistor group; and a third semiconductor switching element (SW3a in FIG. 1A) having a first end connected to the second end of the resistor group. The selecting circuit further comprises an operational amplifier (OP in FIG. 1A) having an inverting input terminal connected in common with second ends of the first semiconductor switching elements in respective ones of the circuit groups, and an output terminal connected in common with second ends of the second semiconductor switching elements in respective ones of the circuit groups; and an output terminal (OUT in FIG. 1A) connected in common with second ends of the third semiconductor switching elements in respective ones of the circuit groups.

The semiconductor switching elements that select signals that are input from the input terminals in the selecting circuit constructed as set forth above are the first and second semiconductor switching elements. A current does not flow through the first semiconductor switching element because this semiconductor switching element is connected between the inverting input terminal of the operational amplifier and any one node between two resistors. The input/output characteristic of the selecting circuit, therefore, is not affected by the ON resistance of the first semiconductor switching element. Further, since the second semiconductor switching element is connected between the output terminal of the operational amplifier and the third semiconductor switching element, which is on the output side of the selecting circuit, the ON resistance possessed by the second semiconductor switching element is reduced in accordance with the gain of the operational amplifier. Thus, the influence of the ON resistance in the first and second semiconductor switching elements on the input/output characteristic of the selecting circuit is very small. Accordingly, non-linearity of a semiconductor switching element that accompanies the ON resistance is almost negligible and signal distortion in the selected signal can be kept extremely small. Further, since a single operational amplifier is used to deal with a plurality of signal sources, die cost is reduced in comparison with a case where an operational amplifier is provided for each of the plurality of signal sources. Examples of the invention will now be described in detail with reference to drawings.

FIRST EXAMPLE

Figure 1A:
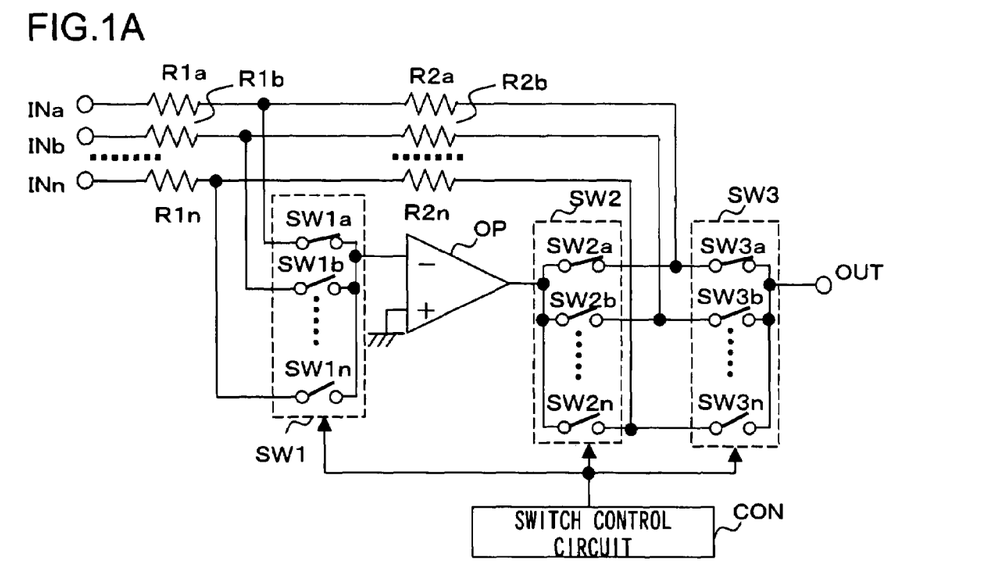
FIG. 1A is a circuit diagram illustrating a selecting circuit according to a first example of the present invention.
Figure 1B:
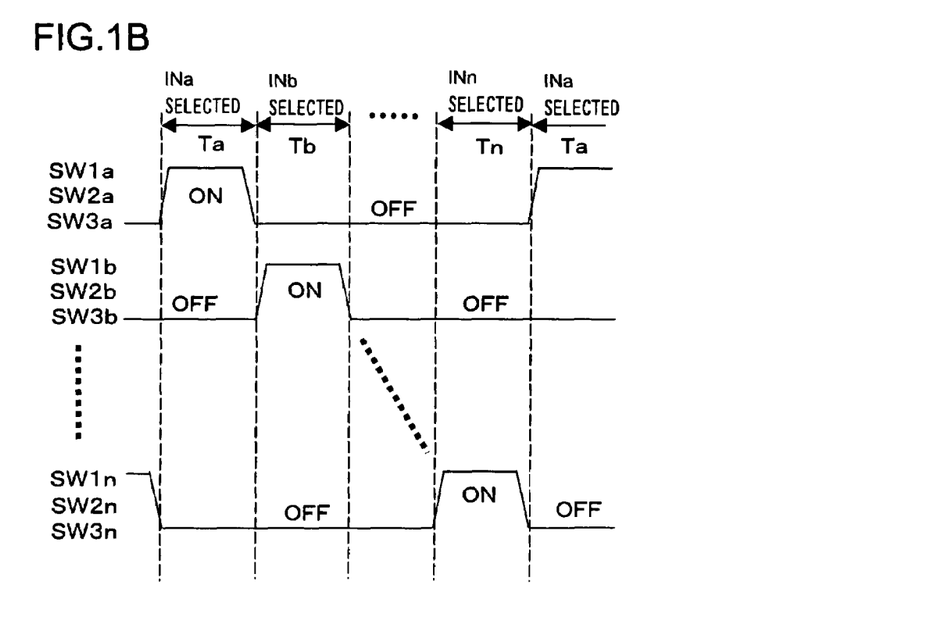
FIG. 1B is a diagram illustrating the operation timing of switches in the selecting circuit.

FIG. 1A is a circuit diagram illustrating a selecting circuit according to a first example of the present invention, and FIG. 1B is a diagram illustrating the operation timing of switches in the selecting circuit. As shown in FIG. 1A, the selecting circuit includes input terminals INa, INb, . . . , INn, resistors R1a, R1b, . . . , R1n, R2a, R2b, . . . , R2n, semiconductor switching elements SW1a, SW1b, . . . SW1n, SW2a, SW2b, . . . , SW2n, SW3a, SW3b, . . . , SW3n, an operational amplifier OP, an output terminal OUT, and a switch control circuit CON.

The input terminals INa, INb, . . . , INn are connected to the resistors R1a, R1b, . . . , R1n, respectively, at first ends thereof. The second ends of the resistors R1a, R1b, . . . , R1n are connected to the semiconductor switching elements SW1a, SW1b, . . . SW1n, respectively, at first ends thereof and to the resistors R2a, R2b, . . . , R2n, respectively, at first ends thereof. The second ends of the resistors R2a, R2b, . . . , R2n are connected to first ends of the semiconductor switching elements SW2a, SW2b, . . . , SW2n, respectively, and to first ends of the semiconductor switching elements SW3a, SW3b, . . . , SW3n, respectively. Second ends of the semiconductor switching elements SW1a, SW1b, . . . SW1n are connected in common with the inverting input terminal of the operational amplifier OP. Second ends of the semiconductor switching elements SW2a, SW2b, . . . , SW2n are connected in common with the output terminal of the operational amplifier OP. The non-inverting input terminal of the operational amplifier is grounded. Second ends of the semiconductor switching elements SW3a, SW3b, . . . , SW3n are connected in common with the output terminal OUT. It should be noted that each semiconductor switching element may be constituted by a FET or by a transfer gate obtained by combining, in parallel, two FETs of mutually different conductivity types.

The semiconductor switching elements SW1a, SW1b, . . . SW1n construct a switch group SW1, the semiconductor switching elements SW2a, SW2b, . . . SW2n construct a switch group SW2, and the semiconductor switching elements SW3a, SW3b, . . . SW3n construct a switch group SW3. The switch groups SW1, SW2 and SW3 operate in association and are controlled in such a manner that one semiconductor switching element contained in each switch group is turned ON by the switch control circuit CON.

FIG. 1B is a time chart illustrating the state of control of the semiconductor switching elements in the switch groups. In a time period Ta in which a signal is input to the input terminal INa, the switch control circuit CON turns on the semiconductor switching elements SW1a, SW2a, SW3a and the operational amplifier OP inverts and amplifies the signal that is input to the input terminal INa and outputs the amplified signal to the output terminal OUT. Similarly, in a time period Tb in which a signal is input to the input terminal INb, the switch control circuit CON turns on the semiconductor switching elements SW1b, SW2b, SW3b and the operational amplifier OP inverts and amplifies the signal that is input to the input terminal INb and outputs the amplified signal to the output terminal OUT. Furthermore, in a time period Tn in which a signal is input to the input terminal INn, the switch control circuit CON turns on the semiconductor switching elements SW1n, SW2n, SW3n and the operational amplifier OP inverts and amplifies the signal that is input to the input terminal INn and outputs the amplified signal to the output terminal OUT.

Figure 2:
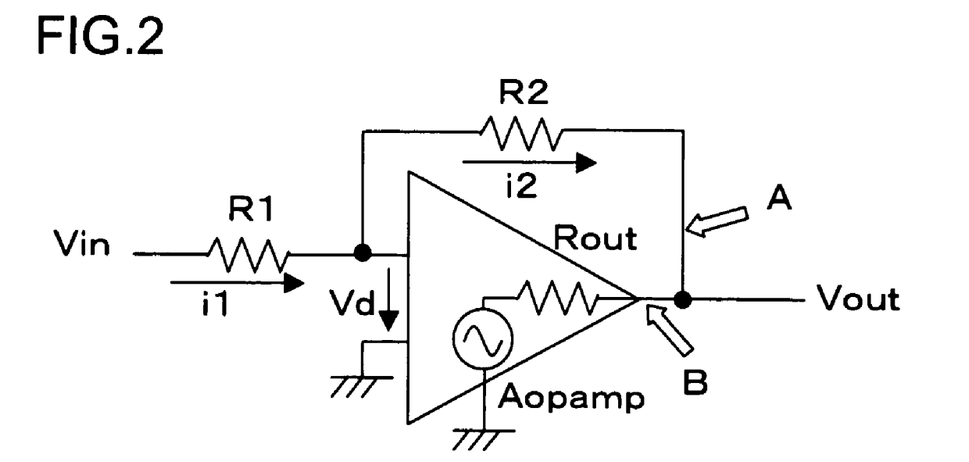
FIG. 2 is an equivalent circuit of a operational amplifier.

Next, the influence of the ON resistance of the semiconductor switching elements SW2a, SW2b, ..., SW2n will be described. FIG. 2 illustrates an equivalent circuit of the operational amplifier OP. The voltage gain of the inverting amplifier in FIG. 2 is represented by Equations (1) and (2) below [these are derived from Equations (7) to (12), described later].

$$\frac{Vout}{Vin} = -\frac{R2}{R1}(1+\Delta_{err})^{-1} \approx -\frac{R2}{R1}(1-\Delta_{err}) \;(\because \Delta_{err} \ll 1) \quad \text{Equation (1)}$$

where the following holds:

$$\Delta_{err} = \frac{1}{A_{OPAMP}}\left(1+\frac{R2}{R1}\right)\left(1+\frac{R_{out}}{R1+R2}\right) \quad \text{Equation (2)}$$

Here $\Delta_{err}$, $A_{OPAMP}$ and $R_{OUT}$ represent an error term, finite open-loop gain of the operational amplifier and output resistance of the operational amplifier, respectively. If we assume that the open-loop gain in an ideal operational amplifier is infinite, then the gain will be expressed by the following equation and the influence of the output resistance of the amplifier will be negligible:

$$\frac{Vout}{Vin} = -\frac{R2}{R1}$$

The influence of the ON resistance of a semiconductor switching element will be discussed. If we let $R_{ON}$ represent the ON resistance of the switching element, the gain and the error term will be represented by Equation (3) below in a case where the switching element is connected in series with resistor R2 (that is, in a case where the switching element is inserted at point A in FIG. 2).

$$\frac{Vout}{Vin} = -\frac{R2+R_{ON}}{R1}(1-\Delta_{err}) \quad \text{Equation (3)}$$

where the following holds:

$$\Delta_{err} = \frac{1}{A_{OPAMP}}\left(1+\frac{R2+R_{ON}}{R1}\right)\left(1+\frac{R_{out}}{R1+R2+R_{ON}}\right)$$

On the other hand, in a case where the switching element is connected in series with the output terminal of the operational amplifier (that is, in a case where the switching element is inserted at point B in FIG. 2), the gain and the error term will be represented by Equation (4) below.

$$\frac{Vout}{Vin} = -\frac{R2}{R1}(1-\Delta_{err}) \quad \text{Equation (4)}$$

where the following holds:

$$\Delta_{err} = \frac{1}{A_{OPAMP}}\left(1+\frac{R2}{R1}\right)\left(1+\frac{R_{out}+R_{ON}}{R1+R2}\right)$$

In general, the open-loop gain of an operational amplifier is sufficiently large, namely on the order of a factor of 5,000 to 20,000, R2/R1 is a factor of several to ten, and the output resistance is on the order of 100Ω. If the difference between voltage gain when the switching element is inserted at point A and voltage gain when the switching element is inserted at point B (i.e., the gain error ascribable to ON resistance of the switching element) is calculated taking the above into consideration, we obtain Equations (5) and (6) below.

$$\left|\frac{Vout}{Vin}\right|_{Ron\_err} \approx -\frac{R_{ON}}{R1} \quad \text{Equation (5)}$$

if the switching element is inserted at point A, and $$\left|\frac{Vout}{Vin}\right|_{Ron\_err} \approx \frac{1}{A_{OPAMP}} \times \frac{R2}{R1} \times \frac{R_{ON}}{R1+R2} \quad \text{Equation (6)}$$

if the switching element is inserted at point B.

The following will be understood if Equations (5) and (6) are compared: In case of Equation (5), the error in voltage gain ascribable to the ON resistance is not negligible because the switching element is in the signal path. On the other hand, in the case of Equation (6), the ON resistance will be negligible if $R_{ON}$ is made approximately $1/A_{OPAMP}$ and the open-loop gain of the operational amplifier is sufficiently large. Accordingly, signal distortion due to $R_{ON}$ can be suppressed by connecting the semiconductor switching element in series with the output resistance of the operational amplifier. That is, in accordance with FIG. 1A, non-linearity due to the semiconductor switching element turned ON in the switch group SW2 has almost no effect upon the input/output characteristic of the selecting circuit.

The process through which Equation (1) is derived will now be discussed. A current i1 that flows into resistor R1 and a current i2 that flows into a resistor R2 are given by Equation (7) below.

$$i_1 = \frac{Vin+Vd}{R1} = i_2 = \frac{-Vd-Vout}{R2} \quad \text{Equation (7)}$$

Since a current that flows between output Vout and input Vin is supplied from the output of the operational amplifier, Equation (8) below is obtained.

$$i_{out} = \frac{Vin-Vout}{R1+R2} = \frac{Vout-A_{OPAMP}Vd}{Rout} \quad \text{Equation (8)}$$

If Vd is derived from Equations (7) and (8), we have Equations (9) and (10).

$$Vd = -\left(\frac{Vin}{R1} + \frac{Vout}{R2}\right) / \left(\frac{1}{R1} + \frac{1}{R2}\right) \quad \text{Equation (9)}$$

$$Vd = -\left(\frac{Vin}{R1+R2} - \left(\frac{1}{R1+R2} + \frac{1}{Rout}\right)Vout\right) / \left(\frac{A_{OPAMP}}{R_{out}}\right) \quad \text{Equation (10)}$$

Equation (11) is obtained by eliminating Vd from Equations (9) and (10).

$$-\left(\frac{1}{R1} + \frac{Rout}{R1R2} \cdot \frac{1}{A_{OPAMP}}\right)Vin = \quad \text{Equation (11)}$$

$$\left[\frac{1}{R2} + \frac{1}{A_{OPAMP}}\left(\frac{Rout}{R1R2} + \frac{R1+R2}{R1R2}\right)\right]Vout$$

$$-\left(\frac{1}{R1} + \frac{Rout}{R1R2} \cdot \frac{1}{A_{OPAMP}}\right)Vin =$$

$$\left[\frac{1}{R2} + \frac{1}{A_{OPAMP}}\left(1 + \frac{R2}{R1}\right)\left(\frac{Rout}{R2(R1+R2)} + \frac{1}{R2}\right)\right]Vout$$

Since Rout<<R1, R2 holds and $A_{OPAMP}$ is sufficiently large in Equation (11) in most cases, the second term on the left side of Equation (11) is negligible and neglected. Equation (12) below is obtained as a result.

$$-\frac{1}{R1}Vin = \quad \text{Equation (12)}$$

$$\left[\frac{1}{R2} + \frac{1}{A_{OPAMP}}\left(1 + \frac{R2}{R1}\right)\left(\frac{1}{R2} + \frac{Rout}{R2(R1+R2)}\right)\right]Vout$$

Equation (1) is obtained by transforming Equation (12) in the manner indicated below.

$$-\frac{R2}{R1}\frac{Vin}{Vout} = \left[1 + \frac{1}{A_{OPAMP}}\left(1 + \frac{R2}{R1}\right)\left(1 + \frac{Rout}{R1+R2}\right)\right]$$

$$\therefore \frac{Vout}{Vin} = -\frac{R2}{R1} \times \left[1 + \frac{1}{A_{OPAMP}}\left(1 + \frac{R2}{R1}\right)\left(1 + \frac{Rout}{R1+R2}\right)\right]^{-1}$$

SECOND EXAMPLE

Figure 3:
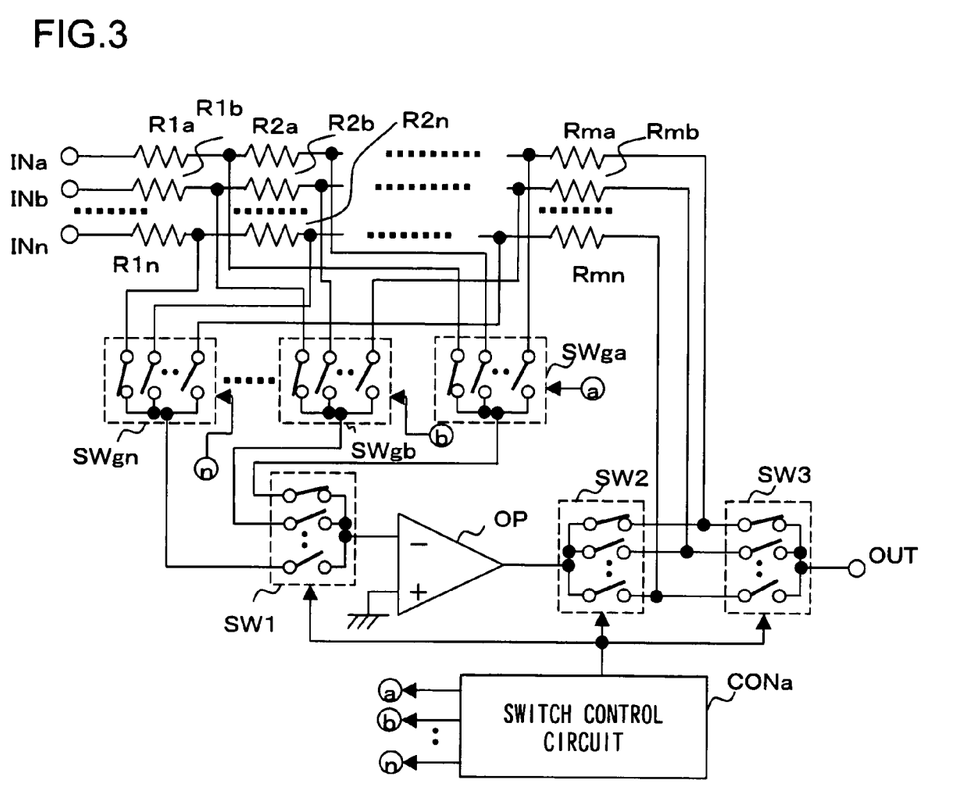
FIG. 3 is a circuit diagram illustrating a selecting circuit according to a second example of the present invention.

FIG. 3 is a circuit diagram illustrating a selecting circuit according to a second example of the present invention. Components in FIG. 3 identical with those shown in FIG. 1A are designated by like reference characters and need not be described again. The selecting circuit shown in FIG. 3 is obtained by additionally providing the arrangement of FIG. 1A with resistors Rma, Rmb, . . . , Rmn (where m is an integer equal to or greater than 3) and switch groups SWga, SWgb, . . . , SWgn comprising semiconductor switching elements. A first end of serially connected resistors R1a, R2a, . . . Rma is connected to the input terminal INa, and a second end of these resistors is connected to first ends of semiconductor switching elements included in respective ones of the switch groups SW2 and SW3, respectively. Further, a first end of serially connected resistors R1b, R2b, . . . Rmb is connected to the input terminal INb, and a second end of these resistors is connected to first ends of other semiconductor switching elements included in respective ones of the switch groups SW2 and SW3, respectively. Furthermore, a first end of serially connected resistors R1n, R2n, . . . Rmn is connected to the input terminal INn, and a second end of these resistors is connected to first ends of yet other semiconductor switching elements included in respective ones of the switch groups SW2 and SW3, respectively.

The switch group SWga selects any one node among a node between resistors R1a and R2a, a node between resistors R2a and R3a, . . . , and a node between R(m−1)a and Rma and connects the selected node to a first end of a semiconductor switching element contained in the switch group SW1. The switch group SWgb selects any one node among a node between resistors R1b and R2b, a node between resistors R2b and R3b, . . . , and a node between R(m−1)b and Rmb and connects the selected node to a first end of another semiconductor switching element contained in the switch group SW2. The switch group SWgn selects any one node among a node between resistors R1n and R2n, a node between resistors R2n and R3n, . . . , and a node between R(m−1)n and Rmn and connects the selected node to a first end of yet another semiconductor switching element contained in the switch group SW2.

A switch control circuit CONa exercises control in a manner similar to the switch control circuit CON shown in FIG. 1A. Furthermore, the switch control circuit CONa exercises control so as to selectively turn on semiconductor switching elements contained in respective ones of the switch groups SWga, SWgb, . . . , SWgn. In this case, the switch groups SWga, SWgb, . . . , SWgn do not operate at timings of the kind shown in FIG. 1B. Rather, as long as the signal sources supplied to the input terminals are identical, the switch groups generally are set fixedly. That is, the switch groups SWga, SWgb, . . . , SWgn function as gain-adjusting semiconductor switching elements on a per-input-terminal basis. By selectively turning on the semiconductor switching elements contained in respective ones of the switch groups SWga, SWgb, . . . , SWgn, the gain of the signal between the input terminal and the output terminal can be adjusted. In this case, at any one of the nodes of the resistors of the semiconductor switching elements turned on in respective ones of the switch groups SWga, SWgb, . . . , SWgn, the gain is decided from the ratio between the sum total of the resistance values of the resistors on the right side of the node and the sum total of the resistance values of the resistors on the left side of the node.

As a modified example for the Second Example as shown in FIG. 3, it is possible to dispense with the switch group SW1, short-circuit all of the contacts included in the switch group SW1 and cause the input-terminal selecting function of the switch group SW1 to be performed instead by the switch groups SWga, SWgb, . . . , SWgn. More specifically, in time period Ta of FIG. 1B in which the signal that is input to the input terminal INa is selected, the switch control circuit CONa exercises control so as to turn on only one semiconductor switching element in the switch group SWga instead of turning on the semiconductor switching element SW1a. In time period Tb in which the signal that is input to the input terminal INb is selected, the switch control circuit CONa exercises control so as to turn on only one semiconductor switching element in the switch group SWgb instead of turning on the semiconductor switching element SW1b. Similarly, in time period Tn in which the signal that is input to the input terminal INn is selected, the switch control circuit CONa exercises control so as to turn on only one semiconductor switching element in the switch group SWgn instead of turning on the semiconductor switching element SW1n. By so arranging it that the switch control circuit CONa operates in this manner, the switch groups SWga, SWgb, ..., SWgn can be provided with a gain adjusting function and an input-terminal selecting function.

THIRD EXAMPLE

Figure 4:
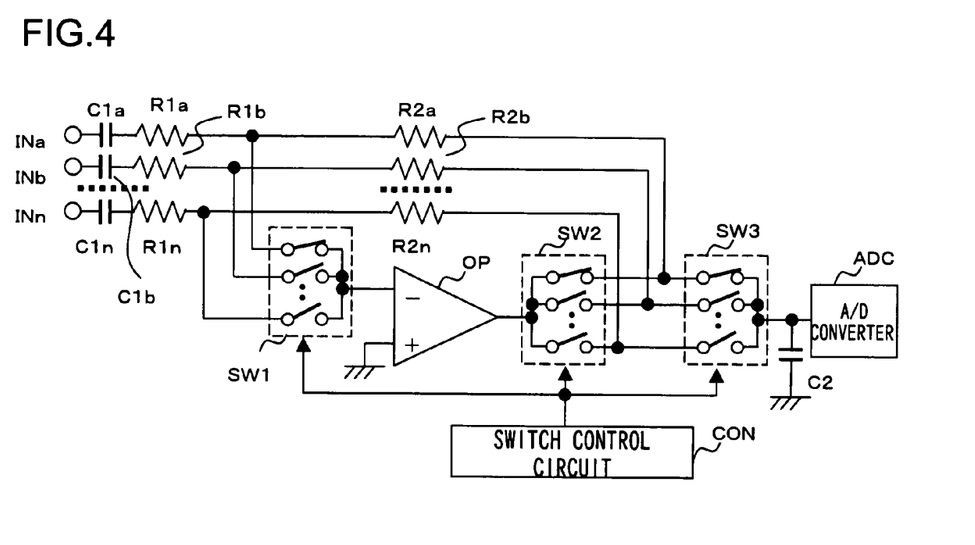
FIG. 4 is a circuit diagram illustrating a selecting circuit according to a third example of the present invention.

FIG. 4 is a circuit diagram illustrating a selecting circuit according to a third example of the present invention. Components in FIG. 4 identical with those shown in FIG. 1A are designated by like reference characters and need not be described again. The selecting circuit shown in FIG. 4 is obtained by additionally providing the arrangement of FIG. 1A with capacitors C1a, C1b, ..., C1n, C2 and an A/D converter ADC. The capacitors C1a, C1b, ..., C1n are inserted between input terminal INa and resistor R1a, between input terminal INb and resistor R1b, ..., and between input terminal INn and resistor R1n, respectively. Further, the capacitor C2 is connected between the common ends of switch group SW3 and the input end of the A/D converter ADC.

In the selecting circuit thus constructed, signals input to respective ones of the input terminals INa, INb, ..., INn are selected upon having their low-frequency components cut by the capacitors C1a, C1b, ..., C1n, respectively (the capacitors C1a, C1b, ..., C1n function as high-pass filters).

The capacitor C2 holds the signal (a sampling signal) selected by the switch group SW3 and functions as a sample-and-hold circuit. In this case, the semiconductor switching elements contained in the switch group SW3 exhibit non-linearity just as the semiconductor switching elements in the switch groups SW1 and SW2. However, even if the semiconductor switching elements contained in the switch group SW3 have an effect upon the rise characteristic of sampling, when the signal is held upon elapse of a sufficient period of time, almost no current flows and there is no error in the voltage value at holding time. The signal that has been held in the capacitor C2 is converted from an analog to a digital signal, this being performed in accordance with the signal selected from the switch control circuit CON from among the signal that are input to respective ones of the input terminals INa, INb, ..., IN.

In a case where analog signals that are output from a plurality of signal sources are selected and subjected to the A/D conversion using the selecting circuit thus constructed, the non-linearity of the semiconductor switching elements can be kept very low and a highly precise A/D conversion can be performed.

FOURTH EXAMPLE

Figure 5:
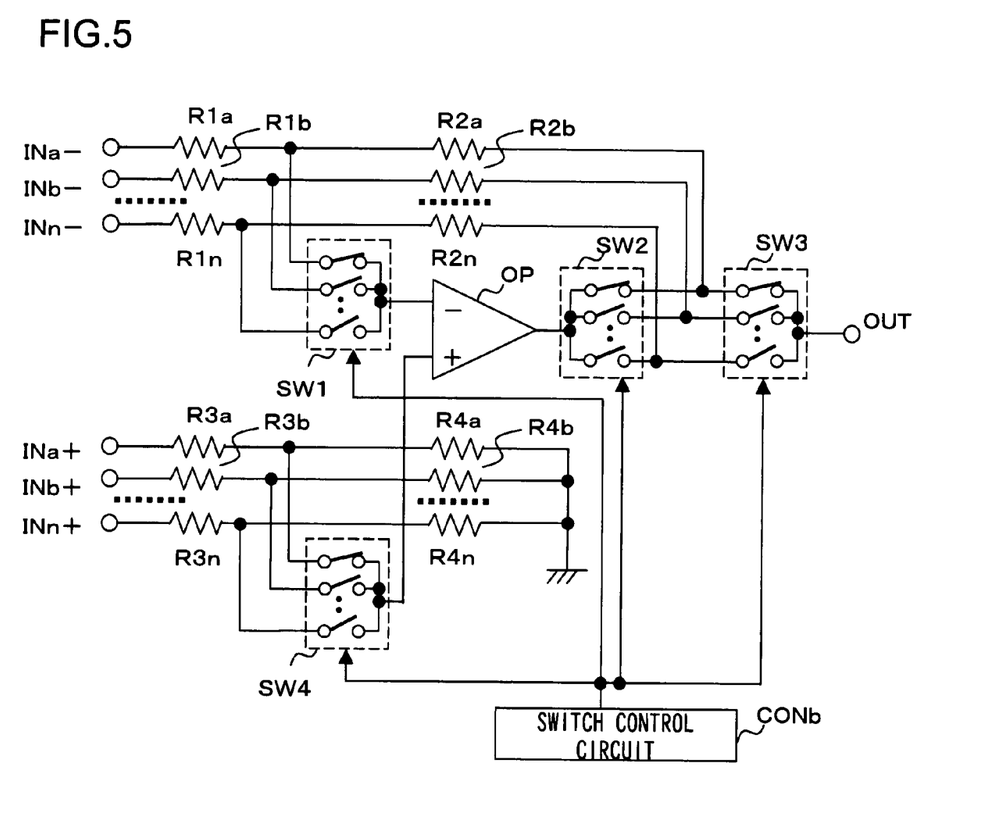
FIG. 5 is a circuit diagram illustrating a selecting circuit according to a fourth example of the present invention.

FIG. 5 is a circuit diagram illustrating a selecting circuit according to a fourth example of the present invention. Components in FIG. 5 identical with those shown in FIG. 1A are designated by like reference characters and need not be described again. The selecting circuit shown in FIG. 5 is obtained by additionally providing the arrangement of FIG. 1A with input terminals Ina+, INb+, ..., INn+, resistors R3a, R3b, ..., R3n, R4a, R4b, ..., R4n and a switch group SW4. The input terminals Ina+, INb+, ..., INn+ are connected to first ends of the resistors R3a, R3b, ..., R3n. Second ends of the resistors R3a, R3b, ..., R3n are connected to first ends of respective semiconductor switching elements in the switch group SW4 and to first ends of the resistors R4a, R4b, ..., R4n, respectively. Second ends of the resistors R4a, R4b, ..., R4n are grounded. Second ends of the semiconductor switching elements in the switch group SW4 are connected in common with the non-inverting input terminal of the operational amplifier OP.

The input terminals INa−, Inb−, ..., INn− correspond to the input terminals INa, INb, ..., INn, respectively, in FIG. 1A. Further, a switch control circuit CONb operates in a manner similar to the switch control circuit CON of FIG. 1A. The switch control circuit CONb operates the switch groups SW1, SW2, SW3 and the switch group SW4 in association and operates so as to selectively turn on the semiconductor switching elements contained in respective ones of the switch groups.

In the selecting circuit thus constructed, differential analog signals output from the signal sources are supplied to respective ones of the input terminals INa+ and INa−, input terminals INb+ and INb−, ..., input terminal INn+ and INn−. One of these differential analog signals is selected by the selectively operated switch groups SW1, SW2, SW3, SW4, and the selected differential analog signal is amplified by the amplifier OP and output to the output terminal OUT.

In accordance with this selecting circuit, non-linearity of semiconductor switching elements can be kept very small. In addition, since the circuit operates so as to select differential analog signals, the anti-noise (noise-suppressing) characteristic with regard to in-phase noise is improved.

FIFTH EXAMPLE

Figure 6:
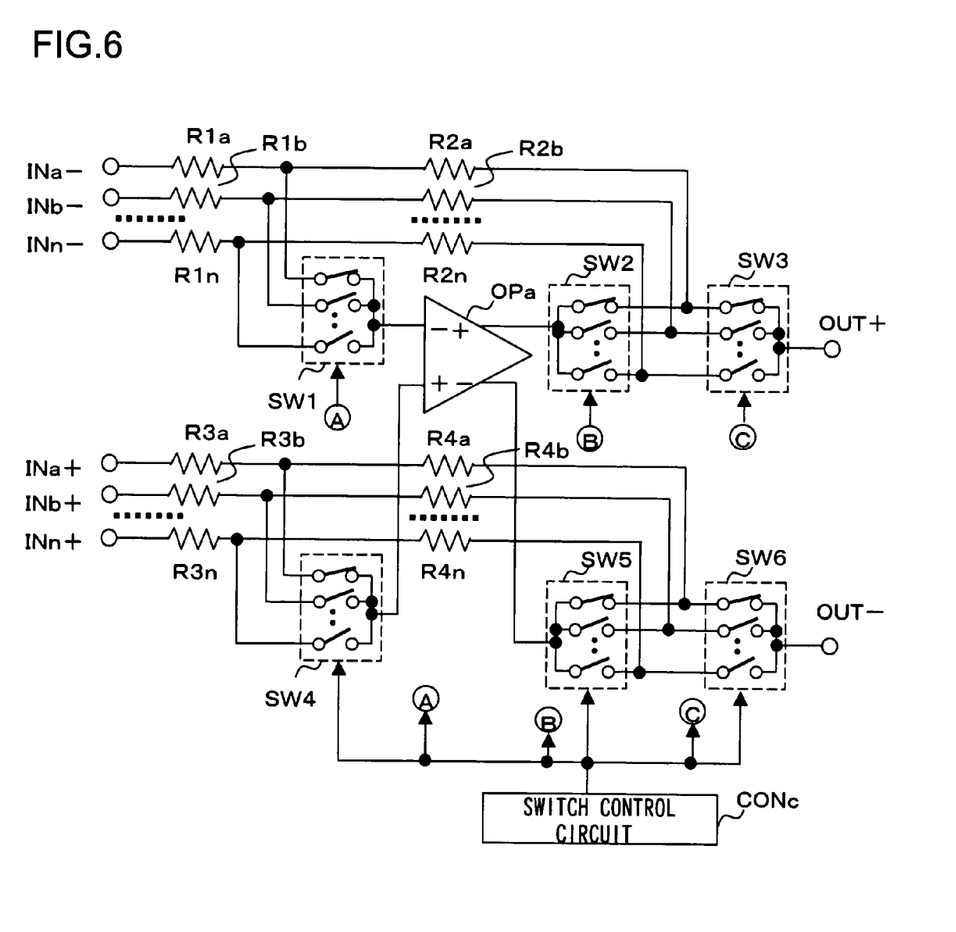
FIG. 6 is a circuit diagram illustrating a selecting circuit according to a fifth example of the present invention.

FIG. 6 is a circuit diagram illustrating a selecting circuit according to a fifth example of the present invention. Components in FIG. 6 identical with those shown in FIG. 5 are designated by like reference characters and need not be described again. The selecting circuit shown in FIG. 6 is obtained by additionally providing the arrangement of FIG. 5 with switch groups SW5, SW6 and an output terminal OUT−. The (non-inverted) output terminal OUT+ corresponds to the output terminal OUT shown in FIG. 1A. Further, an operational amplifier OPa is a differential-input/differential-output amplifier. The second ends of the resistors R4a, R4b, ..., R4n are connected to first ends of respective semiconductor switching elements in the switch group SW5 and to first ends of respective semiconductor switching elements in the switch group SW6. Second ends of semiconductor switching elements in the switch group SW5 are connected in common with the inverting output terminal of the operational amplifier OPa. Second ends of semiconductor switching elements in the switch group SW6 are connected in common with the (inverted) output terminal OUT−.

A switch control circuit CONc operates in a manner similar to the switch control circuit CONb shown in FIG. 5. Furthermore, the switch control circuit CONc exercises control so as to selectively turn on the semiconductor switching elements contained in each of the switch groups SW5, SW6 in sync with the switch groups SW1, SW2, SW3, SW4.

In the selecting circuit constructed as set forth above, differential analog signal that are output from the signal sources are supplied to respective ones of the input terminals INa+ and INa−, input terminals INb+ and INb−, ..., input terminal INn+ and INn−. One of these differential analog signals is selected by the selectively operated switch groups SW1, SW2, SW3, SW4, SW5, SW6 and the selected differential analog signal is amplified by the amplifier OPa and output as, a differential signal from the output terminals OUT+, OUT−.

In accordance with this selecting circuit, non-linearity of semiconductor switching elements can be kept very small. In addition, since differential analog signals are handled overall, the anti-noise characteristic with regard to in-phase noise is improved further.

Although not illustrated in the fourth and fifth examples, gain-adjusting semiconductor switching elements of the kind shown in the second example (FIG. 3) may be added to the non-inverted (positive-) and inverted (negative-phase) paths and the added gain-adjusting semiconductor switching elements may be provided with both a gain adjusting function and an input-terminal selecting function. Further, it is permissible to add capacitors functioning as high-pass filters and a capacitor functioning as a sample-and-hold circuit as illustrated in the third example.

As many apparently widely different examples of the present invention can be made without departing from the spirit and scope thereof, it is to be understood that the invention is not limited to the specific examples thereof except as defined in the appended claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A selecting circuit comprising:
   a plurality of first circuit groups, each of which includes:
     a selecting circuit input terminal;
     a first resistor group composed of two or more serially connected resistors and having a first end connected to said selecting circuit input terminal;
     a first semiconductor switching element having a first end connected to any one node between two resistors in said first resistor group;
     a second semiconductor switching element having a first end connected to a second end of said first resistor group; and
     a third semiconductor switching element having a first end connected to the second end of said first resistor group;
   an operational amplifier having an inverting input terminal connected in common with second ends of said first semiconductor switching elements in respective ones of said first circuit groups, and an output terminal connected in common with second ends of the second semiconductor switching elements in respective ones of said first circuit groups; and
   a selecting circuit output terminal connected in common with second ends of said third semiconductor switching elements in respective ones of said first circuit groups.

2. The selecting circuit according to claim 1, wherein instead of one end of said first semiconductor switching element being connected to any one node between two resistors in said first resistor group, said first resistor group includes three or more resistors, and gain-adjusting semiconductor switching elements are inserted between the first end of said first semiconductor switching element and respective nodes between each of the resistors.

3. The selecting circuit according to claim 1, wherein instead of one end of said first semiconductor switching element being connected to any one node between two resistors in said first resistor group, said first resistor group includes three or more resistors, gain-adjusting semiconductor switching elements are inserted between the inverting input terminal and respective nodes between each of the resistors, and said first semiconductor switching element is eliminated.

4. The selecting circuit according to claim 1, wherein a first capacitor is inserted between said selecting circuit input terminal and said first resistor group.

5. The selecting circuit according to claim 1, wherein a second capacitor is provided between said selecting circuit output terminal and ground.

6. The selecting circuit according to claim 1, further comprising second circuit groups the number of which is identical with the number of said first circuit groups, each of said second circuit groups including:
   a selecting circuit inverted input terminal;
   a second resistor group composed of two or more serially connected resistors and having a first end connected to said selecting circuit inverted input terminal and a second end connected to ground; and
   a fourth semiconductor switching element having a first end connected to any one node between two resistors in said second resistor group;
   wherein said operational amplifier further includes a non-inverting input terminal to which second ends of said fourth semiconductor switching elements in respective ones of said second circuit groups are connected in common.

7. The selecting circuit according to claim 1, further comprising second circuit groups the number of which is identical with the number of said first circuit groups, each of said second circuit groups including:
   a selecting circuit inverted input terminal;
   a second resistor group composed of two or more serially connected resistors and having a first end connected to said selecting circuit inverted input terminal and a second end connected to ground;
   a fourth semiconductor switching element having a first end connected to any one node between two resistors in said second resistor group;
   a fifth semiconductor switching element having a first end connected to a second end of said second resistor group; and
   a sixth semiconductor switching element having a first end connected to a second end of second first resistor group; and
   a selecting circuit inverted output terminal connected in common with second ends of said sixth semiconductor switching elements in respective ones of said second circuit groups;
   wherein said operational amplifier further includes a non-inverting input terminal and an inverting output terminal, second ends of said fourth semiconductor switching elements in respective ones of said second circuit groups being connected in common with the non-inverting terminal, and second ends of said fifth semiconductor switching elements in respective ones of said second circuit groups being connected in common with the inverting output terminal.

8. The selecting circuit according to claim 6, wherein instead of one end of said first semiconductor switching element being connected to any one node between two resistors in said first resistor group, said first resistor group includes three or more resistors, and first gain-adjusting semiconductor switching elements are inserted between the first end of said first semiconductor switching element and respective nodes between each of the resistors; and
   instead of one end of said fourth semiconductor switching element being connected to any one node between two resistors in said second resistor group, said second resistor group includes three or more resistors, and second gain-adjusting semiconductor switching elements are inserted between the first end of said fourth semiconductor switching element and respective nodes between each of the resistors.

9. The selecting circuit according to claim 6, wherein instead of one end of said first semiconductor switching element being connected to any one node between two resistors in said first resistor group, said first resistor group includes three or more resistors, first gain-adjusting semiconductor switching elements are inserted between the inverting input terminal and respective nodes between each of the resistors, and said first semiconductor switching element is eliminated; and     instead of one end of said fourth semiconductor switching element being connected to any one node between two resistors in said second resistor group, said second resistor group includes three or more resistors, second gain-adjusting semiconductor switching elements are inserted between the non-inverting input terminal and respective nodes between each of the resistors, and said fourth semiconductor switching element is eliminated.

10. The selecting circuit according to claim 7, wherein a first capacitor is inserted between said selecting circuit input terminal and said first resistor group; and     a third capacitor is inserted between said selecting circuit inverted input terminal and said second resistor group.

11. The selecting circuit according to claim 7, wherein a fourth capacitor is provided between said selecting circuit output terminal and said selecting circuit inverted input terminal.

12. An A/D converter having the selecting circuit set forth in claim 1 as a front-end circuit.

13. The selecting circuit according to claim 1, wherein a first capacitor is inserted between said selecting circuit input terminal and said first resistor group, and a second capacitor is provided between said selecting circuit output terminal and ground.

14. The selecting circuit according to claim 7, wherein instead of one end of said first semiconductor switching element being connected to any one node between two resistors in said first resistor group, said first resistor group includes three or more resistors, and first gain-adjusting semiconductor switching elements are inserted between the first end of said first semiconductor switching element and respective nodes between each of the resistors; and     instead of one end of said fourth semiconductor switching element being connected to any one node between two resistors in said second resistor group, said second resistor group includes three or more resistors, and second gain-adjusting semiconductor switching elements are inserted between the first end of said fourth semiconductor switching element and respective nodes between each of the resistors.

15. The selecting circuit according to claim 7, wherein instead of one end of said first semiconductor switching element being connected to any one node between two resistors in said first resistor group, said first resistor group includes three or more resistors, first gain-adjusting semiconductor switching elements are inserted between the inverting input terminal and respective nodes between each of the resistors, and said first semiconductor switching element is eliminated; and     instead of one end of said fourth semiconductor switching element being connected to any one node between two resistors in said second resistor group, said second resistor group includes three or more resistors, second gain-adjusting semiconductor switching elements are inserted between the non-inverting input terminal and respective nodes between each of the resistors, and said fourth semiconductor switching element is eliminated.

16. The selecting circuit according to claim 14, wherein a first capacitor is inserted between said selecting circuit input terminal and said first resistor group;

a third capacitor is inserted between said selecting circuit inverted input terminal and said second resistor group, and     a fourth capacitor is provided between said selecting circuit output terminal and said selecting circuit inverted input terminal.

17. An A/D converter having the selecting circuit set forth in claim 6 as a front-end circuit.

18. An A/D converter having the selecting circuit set forth in claim 7 as a front-end circuit.

* * * * *